(12) United States Patent  (10) Patent No.: US 12,310,099 B2
Yamaji  (45) Date of Patent: May 20, 2025

(54) SEMICONDUCTOR DEVICE

(71) Applicant: FUJI ELECTRIC CO., LTD., Kawasaki (JP)

(72) Inventor: Masaharu Yamaji, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 399 days.

(21) Appl. No.: 17/974,894

(22) Filed: Oct. 27, 2022

(65) Prior Publication Data

US 2023/0187438 A1    Jun. 15, 2023

(30) Foreign Application Priority Data

Dec. 14, 2021   (JP) .................................. 2021-202280

(51) Int. Cl.
*H10D 1/47*   (2025.01)
*H10D 30/83*  (2025.01)
*H10D 84/80*  (2025.01)

(52) U.S. Cl.
CPC ............. *H10D 84/811* (2025.01); *H10D 1/47* (2025.01); *H10D 30/83* (2025.01)

(58) Field of Classification Search
CPC ......... H10D 84/811; H10D 1/47; H10D 30/83
See application file for complete search history.

(56) References Cited

U.S. PATENT DOCUMENTS

| 7,306,999 | B2 * | 12/2007 | Hall ..................... | H03K 17/102 |
| | | | | 257/E29.054 |
| 7,803,643 | B2 * | 9/2010 | Hall ....................... | H01L 28/20 |
| | | | | 438/10 |
| 7,955,943 | B2 * | 6/2011 | Hall .................... | H01L 23/5228 |
| | | | | 257/E21.531 |
| 8,680,622 | B2 * | 3/2014 | Saito .................... | H10D 30/603 |
| | | | | 257/379 |
| 8,786,021 | B2 * | 7/2014 | Chan ..................... | H01L 29/808 |
| | | | | 257/355 |

(Continued)

FOREIGN PATENT DOCUMENTS

| CN | 116264226 A | * | 6/2023 | ......... H01L 27/0629 |
| CN | 116666442 A | * | 8/2023 | ........... H01L 29/401 |

(Continued)

*Primary Examiner* — Laura M Menz

(57) ABSTRACT

A semiconductor device includes: an $n^+$-type drain region deposited at an upper part of a p-type semiconductor base body; an n-type drift region deposited to be in contact with the $n^+$-type drain region; an $n^+$-type source region opposed to the $n^+$-type drain region with the n-type drift region interposed; a p-type gate region deposited to be in contact with the n-type drift region; an interlayer insulating film covering the n-type drift region; a resistive element having a spiral-like planar shape provided inside the interlayer insulating film; a drain electrode wire connected to the $n^+$-type drain region and one end of the resistive element; a source electrode wire connected to the $n^+$-type source region; a gate electrode wire connected to the p-type gate region; and a potential-dividing terminal wire connected to the resistive element, wherein a gap between the source electrode wire and an outermost circumference of the resistive element is constant.

11 Claims, 12 Drawing Sheets

(56) References Cited

U.S. PATENT DOCUMENTS

| | | | | |
|---|---|---|---|---|
| 8,860,145 | B2 * | 10/2014 | Saito | H01L 29/7835 257/379 |
| 8,878,330 | B2 * | 11/2014 | Kawahara | H01L 21/761 257/493 |
| 9,048,732 | B2 * | 6/2015 | Lee | H10D 30/83 |
| 9,054,026 | B2 * | 6/2015 | Chan | H01L 29/7817 |
| 9,461,104 | B2 * | 10/2016 | Palumbo | H01L 28/20 |
| 10,566,412 | B2 * | 2/2020 | Karino | H01L 28/24 |
| 2006/0163691 | A1 * | 7/2006 | Hall | H02M 1/36 257/E29.054 |
| 2008/0117653 | A1 * | 5/2008 | Saito | H10D 30/603 257/E27.047 |
| 2009/0323376 | A1 * | 12/2009 | Saito | H10D 30/603 257/379 |
| 2010/0022064 | A1 * | 1/2010 | Hall | H10D 62/307 257/E21.004 |
| 2013/0032922 | A1 * | 2/2013 | Kawahara | H01L 21/761 257/E29.007 |
| 2013/0037906 | A1 * | 2/2013 | Hirler | H01L 29/7397 257/E21.546 |
| 2013/0070429 | A1 * | 3/2013 | Depetro | H10D 84/153 361/748 |
| 2014/0062578 | A1 * | 3/2014 | Chan | H01L 29/7817 257/E21.409 |
| 2014/0217466 | A1 * | 8/2014 | Yamaji | H10D 30/603 257/140 |
| 2014/0232513 | A1 * | 8/2014 | Chan | H10D 84/811 438/238 |
| 2015/0002213 | A1 * | 1/2015 | Zhang | H01L 23/5227 336/186 |
| 2015/0311197 | A1 * | 10/2015 | Saito | H10D 84/87 257/272 |
| 2016/0218169 | A1 * | 7/2016 | Yen | H01L 23/5227 |
| 2016/0276425 | A1 * | 9/2016 | Saito | H01L 27/0629 |
| 2017/0170285 | A1 * | 6/2017 | Tanaka | H01L 29/405 |
| 2017/0170647 | A1 * | 6/2017 | Tanaka | H01L 28/20 |
| 2017/0200818 | A1 * | 7/2017 | Suzuki | H10D 62/8503 |
| 2017/0207296 | A1 * | 7/2017 | Karino | H10D 1/47 |
| 2017/0263724 | A1 * | 9/2017 | Kodera | H01L 29/404 |
| 2019/0348518 | A1 * | 11/2019 | Ito | H10D 64/671 |
| 2023/0187438 | A1 * | 6/2023 | Yamaji | H10D 84/811 257/278 |
| 2023/0275133 | A1 * | 8/2023 | Shitomi | H01L 27/088 257/489 |
| 2024/0421197 | A1 * | 12/2024 | Tanaka | H10D 64/111 |

FOREIGN PATENT DOCUMENTS

| | | | | |
|---|---|---|---|---|
| CN | 118553766 | A * | 8/2024 | |
| DE | 102012107326 | A1 * | 2/2013 | H01L 21/761 |
| DE | 102023104085 | A1 * | 8/2023 | H01L 29/401 |
| JP | 2008153636 | A * | 7/2008 | H01L 29/405 |
| JP | 2017130484 | A * | 7/2017 | H01L 28/20 |
| JP | 6657982 | B2 * | 3/2020 | H01L 28/20 |
| JP | 2020074479 | A * | 5/2020 | H01L 28/20 |
| JP | 6930615 | B2 * | 9/2021 | H01L 28/20 |
| JP | 2022050236 | A * | 3/2022 | |
| JP | 2023087803 | A * | 6/2023 | H01L 27/0629 |
| JP | 2023124206 | A * | 9/2023 | H01L 29/401 |
| WO | WO-2014203487 | A1 * | 12/2014 | H01L 27/0611 |

* cited by examiner

SEMICONDUCTOR DEVICE

CROSS-REFERENCE TO RELATED APPLICATION

This application claims benefit of priority under 35 USC 119 based on Japanese Patent Application No. 2021-202280 filed on Dec. 14, 2021, the entire contents of which are incorporated by reference herein.

BACKGROUND OF THE INVENTION

1. Field of the Invention

The present invention relates to a semiconductor device.

2. Description of the Related Art

A high-voltage junction field effect transistor (JFET) is known as a startup element that is a high-voltage device of a startup circuit used for a conventional switching power supply device, in which a plurality of source regions are arranged into a circular planar layout along a circumference of an input pad having a circular planar shape (refer to JP 2008-153636 A). JP 2008-153636 A discloses that the JFET and a resistive element are provided on the same semiconductor chip, the resistive element being connected in parallel with the JFET to monitor an input voltage applied to the JFET (to exhibit voltage sensing).

The resistive element is connected between an input pad and a gate electrode wire of the JFET. The resistive element is a thin-film resistor of polysilicon (poly-Si), for example, arranged into a spiral planar shape on a voltage blocking structure of the JFET. The resistive element has an end part of an inner circumference connected to a VH terminal wire that is a high-voltage input line via a drain contact penetrating an interlayer insulating film on the resistive element. The resistive element also has an end part of an outer circumference connected to a ground terminal wire via a ground contact penetrating the interlayer insulating film. The resistive element is connected to a potential-dividing terminal wire via a potential-dividing-point contact on the inner circumferential side of the ground contact.

The resistive element includes a potential-dividing resistor with a tip of the potential-dividing terminal wire connected to a non-inverting input terminal of a comparator of a control circuit, and is configured to subject a high input voltage applied to the VH terminal to a potential division to set to 100:1, for example, so as to enable the voltage sensing at a low voltage. A brownout function is known as an applied example of the high-voltage sensing function. When a plug of the switching power supply device is put out of a socket, and a supply of a voltage from an AC input is stopped, the input voltage on the primary side is decreased. If the switching power supply device keeps operating in this state, an ON period of a MOS switch in the control circuit is increased, and a heat generation or, in the worst case, damage is caused. To avoid such a case, the switching power supply device has the brownout function for stopping the switching operation of the power supply in case of a reduction in the input voltage. For example, when the input voltage on the primary side is decreased, a voltage of the non-inverting input terminal of the comparator connected to the potential-dividing point of the potential-dividing resistor described above is decreased more than a voltage of an inverting input terminal connected to a reference power supply. This leads a driver output signal of the control circuit to be inverted to be in a low state to stop the switching operation.

JP 6657982 B2 discloses a configuration in which a ground terminal wire or a potential-dividing terminal wire is connected to a resistive element on the inner side of the outermost circumference, and a source electrode wire not covered is provided on a potential-dividing resistor that serves as a resistor, so as to avoid a variation in resistance value derived from a hydrogen absorbing effect of titanium (Ti) that is barrier metal used for the source electrode wire to prevent an error in detection caused by a variation of a potential-dividing point.

The demand for a great decrease in standby power consumption of communication devices and home appliances, for example, has increased recently, and the switching power supply device is also required to decrease electric power consumption as much as possible upon standby or during the operation of the device. To achieve such a demand, for example, some trials have been made such that an impurity concentration of the polysilicon resistor as a resistive element connected to the VH terminal and the ground terminal of the startup element is reduced so as to increase a sheet resistance, and the number of loops of the polysilicon resistor is increased as much as possible so as to provide a high-resistance element of the order of hundreds of MΩ.

When the sheet resistance of the polysilicon resistor is increased to about 10 kΩ/sq, for example, the polysilicon having a low impurity concentration causes a shift in the resistance value to lead to a variation of the potential-dividing point because of the hydrogen absorbing effect of titanium (Ti) only if a metal wire such as a source electrode wire is arranged contiguously.

While the source electrode wire is arranged to be concentric with the drain region having a circular shape in a planar view, the polysilicon resistor has a spiral pattern and thus has a distance that is not constant from the potential-dividing resistor on the outermost circumferential side to the source electrode wire, and is more contiguous to the source electrode wire as closer to the outer circumferential side (the ground potential side), having an influence on the variation in the resistance value. If the source electrode wire is uniformly moved toward the outer circumferential side to avoid the variation, the width of the source electrode wire is locally decreased, which leads to an excess of an allowable current density and may result in a burnout of the wire.

SUMMARY OF THE INVENTION

In view of the foregoing problems, the present invention provides a semiconductor device having a structure in which a JFET and a spiral-shaped resistive element are arranged on the same semiconductor chip, the structure being capable of avoiding a variation in resistance value of the resistive element.

An aspect of the present invention provides a semiconductor device including: a first region of a second conductivity type deposited at an upper part of a semiconductor base body of a first conductivity type; a second region of the second conductivity type deposited at an upper part of the semiconductor base body so as to be in contact with the first region; a third region of the second conductivity type deposited at an upper part of the semiconductor base body and opposed to the first region with the second region interposed so as to be in contact with the second region; a fourth region of the first conductivity type deposited at an upper part of the semiconductor base body so as to be in contact with the second region; an interlayer insulating film covering the second region; a resistive element having a spiral-like planar shape provided inside the interlayer insulating film; a first electrode wire electrically connected to the first region and one end of the resistive element; a second electrode wire electrically connected to the third region and provided along a circumference of the resistive element; a third electrode wire electrically connected to the fourth region and provided along the circumference of the resistive element; and a potential-dividing terminal wire electrically connected to the resistive element, wherein a metal wire opposed to an outermost circumference serving as a resistor of the resistive element has a part at which a gap between the metal wire and the outermost circumference is constant.

DETAILED DESCRIPTION

Figure 1:
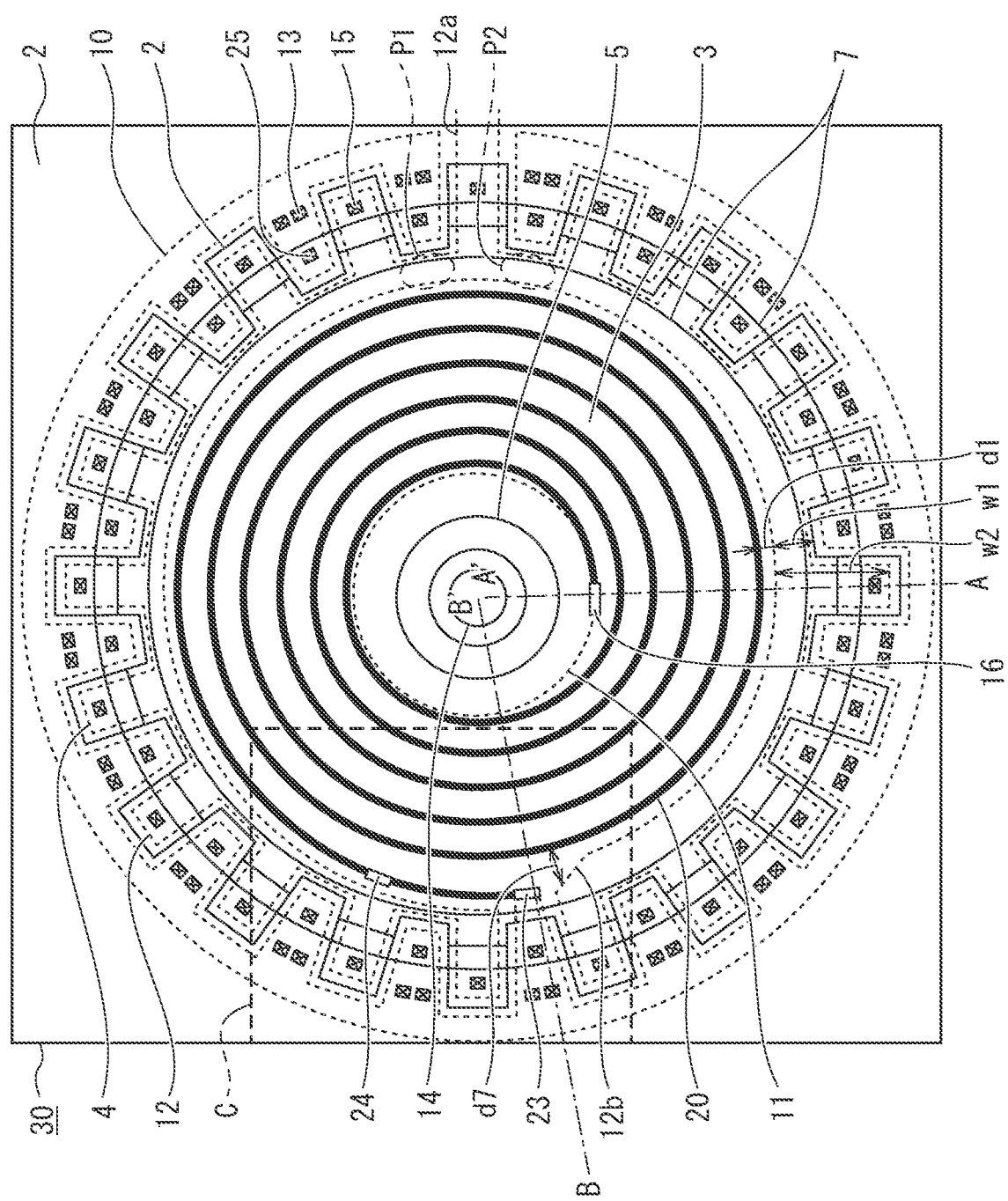
FIG. 1 is a plan view illustrating a semiconductor device according to a first embodiment of the present invention.

With reference to the Drawings, first to fourth embodiments of the present invention will be described below.

In the Drawings, the same or similar elements are indicated by the same or similar reference numerals. The Drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions. The first to fourth embodiments described below merely illustrate schematically devices and methods for specifying and giving shapes to the technical idea of the present invention, and the span of the technical idea is not limited to materials, shapes, structures, and relative positions of elements described herein.

In the Specification, definitions of directions such as an up-and-down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

In the Specification, there is exemplified a case where a first conductivity-type is an p-type and a second conductivity-type is a n-type. However, the relationship of the conductivity-types may be inverted to set the first conductivity-type to the n-type and the second conductivity-type to the p-type. Further, a semiconductor region denoted by the symbol "n" or "p" attached with "+" indicates that such semiconductor region has a relatively high impurity concentration as compared to a semiconductor region denoted by the symbol "n" or "p" without "+". A semiconductor region denoted by the symbol "n" or "p" attached with "−" indicates that such semiconductor region has a relatively low impurity concentration as compared to a semiconductor region denoted by the symbol "n" or "p" without "−". However, even when the semiconductor regions are denoted by the same reference symbols "n" and "n", it is not indicated that the semiconductor regions have exactly the same impurity concentration. Moreover, the members and the regions that are limited by adding "first conductivity-type" and "second conductivity-type" in the following description indicate the members and the regions formed of semiconductor materials without particular obvious limitations.

First Embodiment

Figure 2:
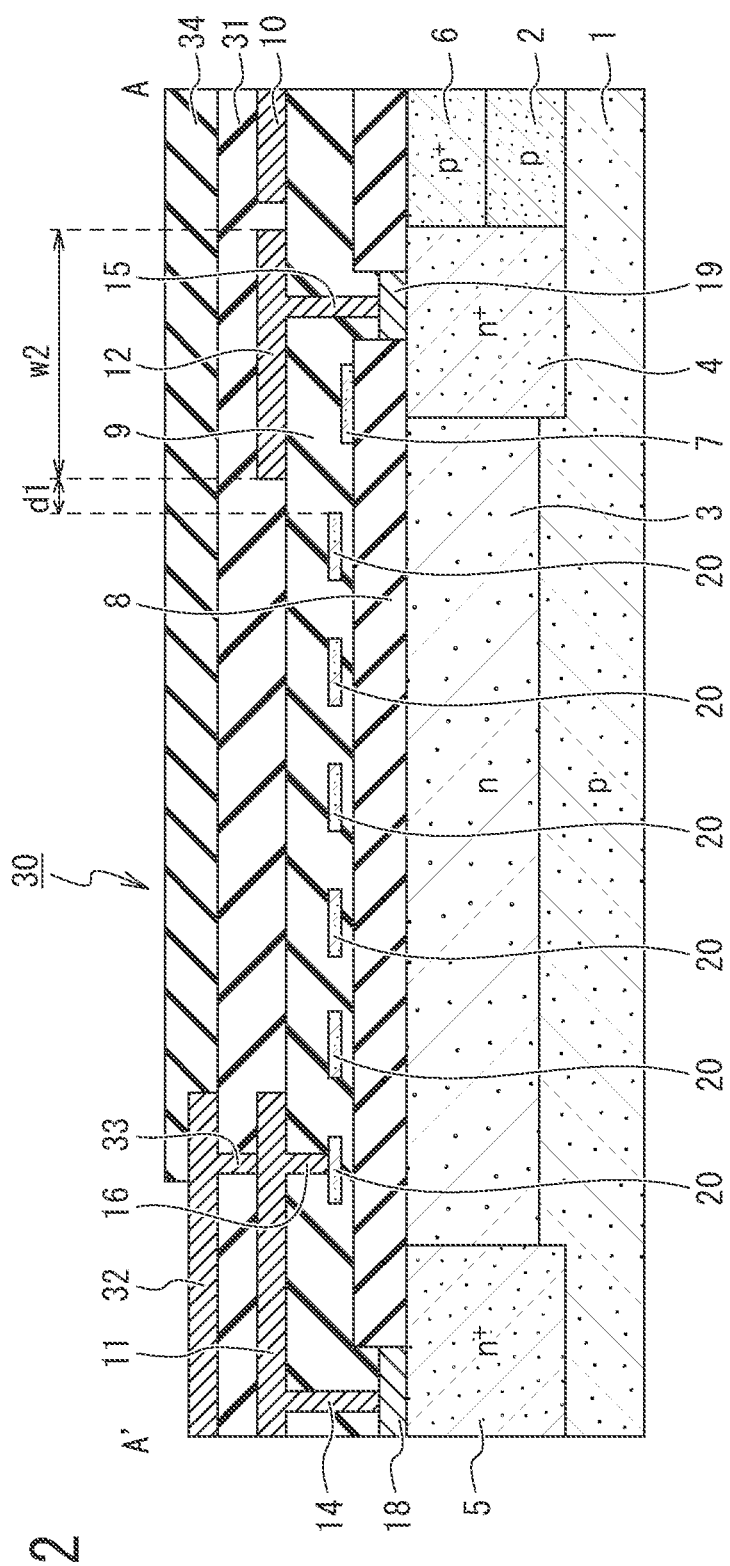
FIG. 2 is a cross-sectional view taken along cross-sectional line A-A' in FIG. 1.
Figure 3:
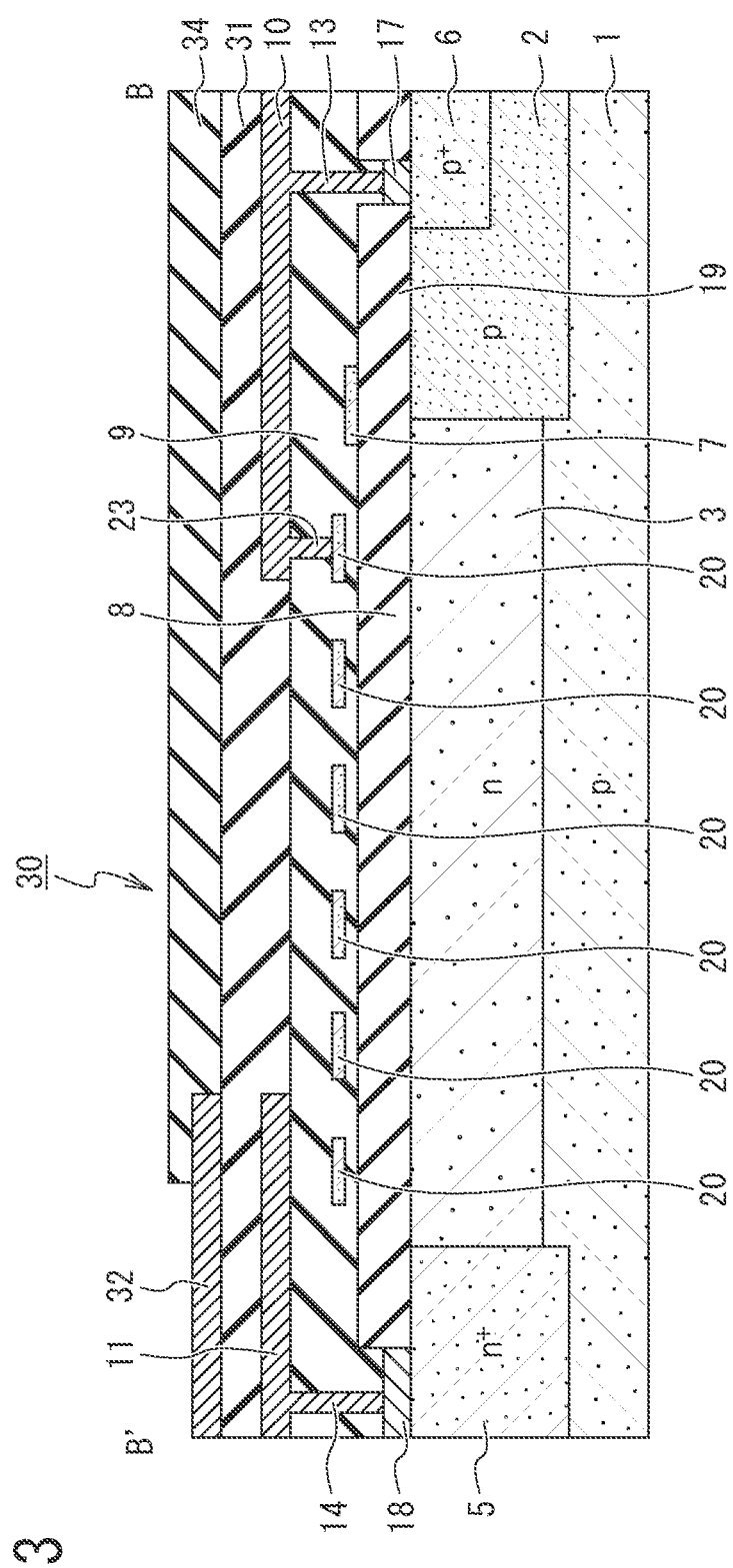
FIG. 3 is a cross-sectional view taken along cross-sectional line B-B' in FIG. 1.

FIG. 1 is a plan view illustrating a semiconductor device according to a first embodiment. FIG. 2 is a cross-sectional view taken along cross-sectional line A-A' in FIG. 1. FIG. 3 is a cross-sectional view taken along cross-sectional line B-B' in FIG. 1. As illustrated in FIG. 1 to FIG. 3, the semiconductor device according to the first embodiment is an integrated circuit (IC) in which a high-voltage JFET 30 and a resistive element 20 having a spiral planar shape are integrated on the same semiconductor chip (a p-type semiconductor base body) 1. The JFET 30 is a startup element of a startup circuit used for a switching power supply device (not illustrated). The resistive element 20 monitors an input voltage applied to the JFET 30 (for voltage sensing), so as to exhibit a brownout function and the like.

As illustrated in FIG. 2 and FIG. 3, the JFET 30 is provided on the p-type semiconductor base body 1. The p-type semiconductor base body 1 is a silicon (Si) substrate, for example. The p-type semiconductor base body 1 may be a semiconductor substrate made from silicon carbide (SiC), gallium nitride (GaN), gallium arsenide (GaAs), or diamond, for example. The p-type semiconductor base body 1 may be a p-type epitaxially-grown layer provided on a semiconductor substrate instead.

A drain region (a first region) 5 of $n^+$-type is selectively deposited at an upper part of the p-type semiconductor base body 1. A drift region (a second region) 3 of n-type having a lower impurity concentration than the $n^+$-type drain region 5 is selectively deposited at an upper part of the p-type semiconductor base body 1 so as to be in contact with the $n^+$-type drain region 5. A source region (a third region) 4 of $n^+$-type having a higher impurity concentration than the n-type drift region 3 is selectively deposited at an upper part of the p-type semiconductor base body 1 separately from the $n^+$-type drain region 5. The $n^+$-type source region 4 is in contact with the n-type drift region 3 and is opposed to the n+-type drain region 5 with the n-type drift region 3 interposed. The present embodiment is illustrated with a case in which the n+-type source region 4 and the n+-type drain region 5 are each deposited to have a greater depth than the n-type drift region 3, but is not limited to this case. The n+-type source region 4 and the n+-type drain region 5 may each have a smaller depth than the n-type drift region 3, or may each have the same depth as the n-type drift region 3.

As illustrated in FIG. 2, a gate region (a fourth region) 2 of p-type is selectively deposited at an upper part of the p-type semiconductor base body 1 so as to be in contact with the n-type source region 4. As illustrated in FIG. 3, the p-type gate region 2 is in contact with the n-type drift region 3. A contact region 6 of p+-type having a higher impurity concentration than the p-type gate region 2 is selectively deposited at an upper part of the p-type gate region 2 so as to be in contact with the p-type gate region 2. The present embodiment is illustrated with a case in which the p-type gate region 2 is deposited to have a greater depth than the n-type drift region 3, but is not limited to this case. The p-type gate region 2 may have a smaller depth than the n-type drift region 3, or may have the same depth as the n-type drift region 3.

As illustrated in FIG. 1, the n+-type drain region 5 has a substantially circular planar shape. The n-type drift region 3 is provided to surround the circumference of the n+-type drain region 5. The n-type drift region 3 has a gear-like planar shape, for example, and partly enters the corresponding parts of the p-type gate region 2 (at 20 parts, for example) to have a predetermined width. The n+-type source region 4 is provided at plural parts on the circumference of the circle having the same distance from the n+-type drain region 5 so as to be provided in the n-type drift region 3 at the parts entering the gear-shaped p-type gate region 2. The p-type gate region 2 thus has a planar shape interposing the n+-type source region 4 in a direction perpendicular to a direction connecting the n+-type source region 4 and the n+-type drain region 5. The p-type gate region 2 extends from the outside of the n+-type source region 4 to a position closer to the n+-type drain region 5 than the n+-type source region 4 at the respective parts interposing the n+-type source region 4.

As illustrated in FIG. 2 and FIG. 3, an element isolation insulating film 8 such as a film of local oxidation of silicon (a LOCOS film) is deposited on the n-type drift region 3. A gate polysilicon electrode 7 is provided on the element isolation insulating film 8. As illustrated in FIG. 1, the gate polysilicon electrode 7 has a ring-like planar shape so as to be located across the part at which the n-type drift region 3 and the p-type gate region 2 are in contact with each other. The gate polysilicon electrode 7 is electrically connected to a gate electrode wire 10 described below via a gate polysilicon contact 25. The gate polysilicon electrode 7 has a function of expanding a spread of a depletion layer extending from a p-n junction between the p-type gate region 2 and the n+-type source region 4 when a potential of a source electrode wire 12 described below is increased to lead the p-n junction to reverse bias. This avoids an increase in potential of the source electrode wire 12.

As illustrated in FIG. 2 and FIG. 3, an interlayer insulating film 9 is deposited to cover the element isolation insulating film 8, the gate polysilicon electrode 7, the p+-type contact region 6, the n+-type source region 4, and the n+-type drain region 5. A drain electrode wire (a first electrode wire) 11, a source electrode wire (a second electrode wire) 12, and the gate electrode wire (a third electrode wire) 10, which are each a metal wire, are provided on the interlayer insulating film 9. FIG. 1 schematically indicates the drain electrode wire 11, the source electrode wire 12, and the gate electrode wire 10 by the dotted lines.

As illustrated in FIG. 1, the drain electrode wire 11 has a substantially circular planar shape concentric with the n+-type drain region 5. As illustrated in FIG. 2 and FIG. 3, the drain electrode wire 11 is opposed to the n+-type drain region 5 in the depth direction with the interlayer insulating film 9 interposed. The drain electrode wire 11 is electrically connected to the n+-type drain region 5 via a drain contact 14 penetrating the interlayer insulating film 9 and a contact plug 18. The drain electrode wire 11 extends to protrude toward the outside over the interlayer insulating film 9, and is opposed to the innermost circumferential part of the resistive element 20 as described below in the depth direction with the interlayer insulating film 9 interposed. As illustrated in FIG. 2, the drain electrode wire 11 is electrically connected to the innermost circumferential part of the resistive element 20 via a resistive element contact 16 penetrating the interlayer insulating film 9.

As illustrated in FIG. 1, the gate electrode wire 10 has a substantially ring-like planar shape. The ring-shaped outer circumference of the gate electrode wire 10 has a substantially circular shape concentric with the n+-type drain region 5. The ring-shaped inner circumference of the gate electrode wire 10 enters the inner side (toward the n+-type drain region 5) to have a predetermined width along the n-type drift region 3 formed in the gear-shaped state and the n+-type source region 4. As illustrated in FIG. 2 and FIG. 3, the gate electrode wire 10 is opposed to the p-type gate region 2 in the depth direction with the interlayer insulating film 9 interposed. As illustrated in FIG. 3, the gate electrode wire 10 is electrically connected to the p+-type contact region 6 via a gate contact 13 penetrating the interlayer insulating film 9 and a contact plug 17. The gate electrode wire 10 is constantly grounded.

As illustrated in FIG. 1, the source electrode wire 12 has a substantially ring-like planar shape, which is cut off at a position adjacent to the outer circumferential end part of the resistive element 20. The ring-shaped outer circumference of the source electrode wire 12 is separated from the gate electrode wire 10 and enters the outer side to have a predetermined width along the n-type drift region 3 formed in the gear-shaped state and the n+-type source region 4. The source electrode wire 12 is connected with a drawn line 12a to be electrically connected to the outside. While FIG. 1 illustrates the case in which the drawn line 12a is provided on the right side in FIG. 1, the position of the drawn line 12a may be determined as appropriate. The number of the drawn lines connected to the source electrode wire 12 can also be determined as appropriate.

As illustrated in FIG. 2, the source electrode wire 12 is opposed to the n+-type source region 4 in the depth direction with the interlayer insulating film 9 interposed. The source electrode wire 12 is electrically connected to the n+-type source region 4 via a source contact 15 penetrating the interlayer insulating film 9 and a contact plug 19. The source electrode wire 12 extends to protrude toward the inside over the interlayer insulating film 9, and is opposed to the gate polysilicon electrode 7 in the depth direction with the interlayer insulating film 9 interposed.

The respective metal wires of the gate electrode wire 10, the drain electrode wire 11, and the source electrode wire 12 are composed of a stacked metal film including barrier metal, an aluminum (Al) metal film, and a reflection-preventing film stacked in this order. The parts buried in the contact holes of the stacked metal film serve as the gate contact 13, the drain contact 14, the source contact 15, and the resistive element contact 16. The contact plug 17, the contact plug 18, and the contact plug 19 are each composed of a stacked metal film including barrier metal and a tungsten (W) film sequentially stacked. The term "aluminum metal film" refers to a metal film containing aluminum, and may be an aluminum-copper (Al—Cu) film or an aluminum-silicon-copper (Al—Si—Cu) film, for example.

The barrier metal used for the gate electrode wire 10, the drain electrode wire 11, the source electrode wire 12, and the like has a function of preventing diffusion of metal atoms toward the p-type semiconductor base body 1 or a mutual reaction between the p-type semiconductor base body 1 and the metal film. The barrier metal may be a stacked film including a titanium (Ti) film and a titanium nitride (TiN) film sequentially stacked, for example. The barrier metal of the contact plug 17, the contact plug 18, and the contact plug 19 is subjected to silicidation (a decrease in resistance) by a reaction with a semiconductor part. The refection preventing film may be a stacked film including a titanium film and a titanium nitride film sequentially stacked. The reflection-preventing film has a function of preventing diffused reflection of light on the aluminum metal film upon the exposure of a photoresist mask for patterning used for the aluminum metal film.

The respective metal wires of the gate electrode wire 10, the drain electrode wire 11, and the source electrode wire 12 may each be a multi-layer wire. FIG. 2 illustrates a case in which the drain electrode wires 11 and 32 are each a multi-layer wire. An interlayer insulating film 31 is deposited on the interlayer insulating film 9, the gate electrode wire 10, and the drain electrode wire 11 as the first layer and the source electrode wire 12. The drain electrode wire 32 as the second layer is opposed to the drain electrode wire 11 as the first layer and is deposited on the interlayer insulating film 31 in the depth direction with the interlayer insulating film 31 interposed. The drain electrode wire 32 as the second layer is electrically connected to the drain electrode wire 11 as the first layer via the drain contact 33 penetrating the interlayer insulating film 31.

As illustrated in FIG. 1, the resistive element 20 is arranged into a spiral-like planar shape surrounding the circumference of the n-type drain region 5. While FIG. 1 illustrates the case in which the resistive element 20 is formed into a clockwise spiral state toward the outer circumferential side, the resistive element 20 may be formed into a counterclockwise spiral shape toward the outer circumferential side.

As illustrated in FIG. 2 and FIG. 3, the resistive element 20 is provided at a part opposed to the n-type drift region 3 in the depth direction inside the interlayer insulating film 9 with the element isolation insulating film 8 interposed. The resistive element 20 is located on the inner side of the gate polysilicon electrode 7 separately from the gate polysilicon electrode 7. As illustrated in FIG. 2, the innermost circumferential part of the resistive element 20 is electrically connected to the drain electrode wire 11 via the resistive element contact 16 as described above.

The inner diameter of the resistive element 20 is defined to be smaller than the diameter of the drain electrode wire 11 to the extent that is sufficient to form the resistive element contact 16 via which the resistive element 20 is connected to the drain electrode wire 11. The outer diameter of the resistive element 20 is smaller than the inner diameter of the source electrode wire 12 so as not to overlap with the source electrode wire 12. The term "innermost circumferential part" of the resistive element 20 refers to a part of the spiral line located on the innermost side of the resistive element 20 with no part of the spiral line next to each other on the inner side. The term "outermost circumferential part" of the resistive element 20 refers to a part of the spiral line located on the outermost side of the resistive element 20 with no part of the spiral line next to each other on the outer side.

Figure 4:
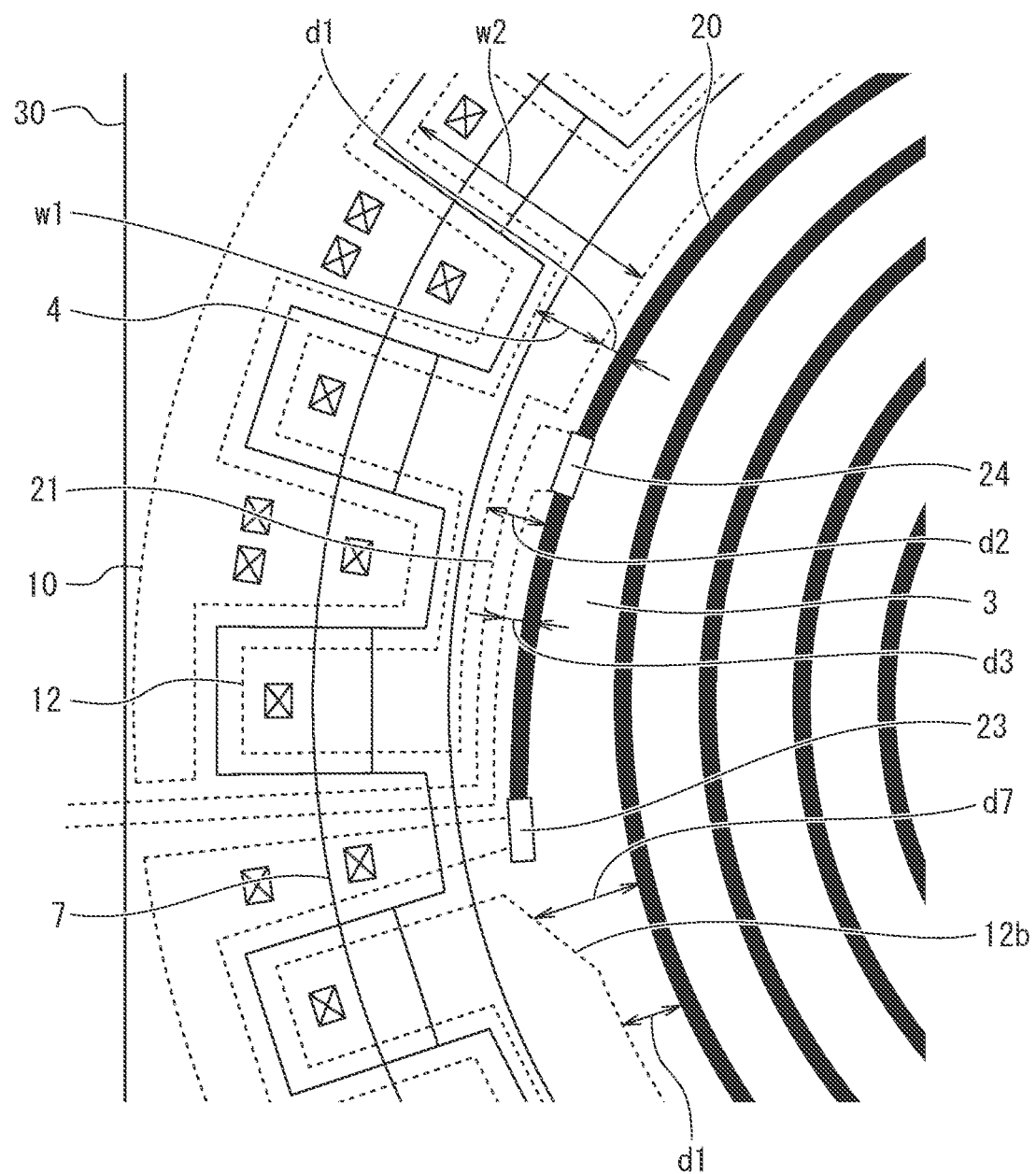
FIG. 4 is a plan view illustrating partly-enlarged region C in FIG. 1.

FIG. 4 is an enlarged plan view illustrating region C including the end part of the resistive element 20 on the outer circumferential side illustrated in FIG. 1. As illustrated in FIG. 4, the substantially ring-like planar shape of the gate electrode wire 10 is cut off at a position adjacent to the end part of the resistive element 20 on the outer circumferential side. As illustrated in FIG. 3 and FIG. 4, the end part of the resistive element 20 on the outer circumferential side is connected to the gate electrode wire 10 via a ground contact 23 penetrating the interlayer insulating film 9. The ground contact 23 may be connected to a ground terminal wire different from the gate electrode wire 10 so that the ground terminal wire is extracted to the outside and grounded.

As illustrated in FIG. 4, the resistive element 20 is connected to a potential-dividing terminal wire 21 via a potential-dividing-point contact 24 penetrating the interlayer insulating film 9 at a position on the inner circumferential side of the position connected to the ground contact 23. The potential-dividing terminal wire 21 is a terminal for sensing an input voltage applied to an input pad of the JFET 30, and divides and outputs the input voltage to a voltage sensing circuit. As the position of the resistive element 20 connected to the potential-dividing terminal wire 21 is closer to the inner circumferential side, the potential of the potential-dividing terminal wire 21 output to the voltage sensing circuit is higher. The potential-dividing terminal wire 21 is thus connected to a position at which the input voltage applied to the input pad of the JFET 30 can be divided to less than a breakdown voltage of the voltage sensing circuit. For example, the potential-dividing terminal wire 21 is connected to a position at which a potential that is $1/100$ of the input voltage applied to the input pad of the JFET 30 is extracted.

The potential-dividing terminal wire 21 is arranged on the same layer level as the source electrode wire 12 and the gate electrode wire 10, and is made from the same material as the source electrode wire 12 and the gate electrode wire 10. The potential-dividing terminal wire 21 extends to be opposed to a part of the outermost circumference of the resistive element 20, and is extracted to the outside at the position at which the substantially ring-like shape of each of the source electrode wire 12 and the gate electrode wire 10 is cut off. The source electrode wire 12 is retracted toward the outside to make a space for the potential-dividing terminal wire 21 at the position at which the potential-dividing terminal wire 21 extends to be opposed to a part of the outermost circumference of the resistive element 20. The potential-dividing terminal wire 21 may be arranged on a layer level different from the source electrode wire 12 and the gate electrode wire 10. For example, the source electrode wire 12 and the gate electrode wire 10 may be arranged as the first layer of the multi-layered wire, and the potential-dividing terminal wire 21 may be arranged as the second layer of the multi-layered wire.

It is determined whether the JFET 30 having the configuration described above is turned ON or OFF depending on the potential of the potential-dividing terminal wire 21. For example, the determination is made such that the potential of the source electrode wire 12 is increased by the voltage sensing circuit (not illustrated) electrically connected to the source electrode wire 12 in accordance with the potential of the potential-dividing terminal wire 21 so as to lead the p-n junction between the n⁺-type source region 4 and the p-type gate region 2 to reverse bias. This connects a depletion layer extending from the p-type gate region 2 on both sides of the n⁺-type source region 4 at the frontage between the n⁺-type source region 4 and the n-type drift region 3 (the interface between n⁺-type source region 4 and the n-type drift region 3), so as to cut off the current of the JFET 30 to turn OFF the JFET 30.

The semiconductor device according to the first embodiment has a structure in which the source electrode wire 12 that is the metal wire is opposed to the outermost circumference serving as a resistor of the resistive element 20, as illustrated in FIG. 1. The source electrode wire 12 has a part at which a gap d1 between the source electrode wire 12 and the outermost circumference serving as a resistor of the resistive element 20 is constant. The expression "the gap is constant" as used in this specification includes not only a case in which the gap is completely constant but also a case in which the gap is not necessarily constant but the respective elements are substantially parallel to each other.

The source electrode wire 12 is opposed to the outermost circumference of the resistive element 20 halfway around or more, along substantially the entire outermost circumference of the resistive element 20. The gap d1 between the inner circumference of the source electrode wire 12 and the outermost circumference of the resistive element 20 is constant halfway around or more, along substantially the entire outermost circumference of the resistive element 20. In other words, the substantially ring-shaped inner circumference of the source electrode wire 12 is provided parallel to the outermost circumference of the resistive element 20 having a spiral planar shape without not being concentric with the n⁺-type drain region 5. The gap d1 is set to a range of about one micrometer to two micrometers, for example, and may be adjusted as appropriate.

The source electrode wire 12 includes a slope part 12b at the end of the region in which the gap d1 between the source electrode wire 12 and the resistive element 20 is constant. A width w1 of the source electrode wire 12 is gradually decreased at the slope part 12b as being closer to the position at which the substantially ring-like shape of the source electrode wire 12 is cut off so that the gap d1 between the source electrode wire 12 and the resistive element 20 is gradually increased. The length of the part in which the gap d1 between the source electrode wire 12 and the resistive element 20 is constant is shorter as the length of the slope part 12b is longer. The length of the slope part 12b and the length of the part in which the gap d1 between the source electrode wire 12 and the resistive element 20 is constant can be determined as appropriate.

As illustrated in FIG. 4, the potential-dividing terminal wire 21 that is a metal wire has a part opposed to the outermost circumference of the resistive element 20 and having a constant gap d3 between the potential-dividing terminal wire 21 and the outermost circumference of the resistive element 20. The potential-dividing terminal wire 21 is arranged into a curved line parallel to the spiral resistive element 20 at the position at which the potential-dividing terminal wire 21 is opposed to the outermost circumference of the resistive element 20. The gap d3 between the potential-dividing terminal wire 21 and the outermost circumference of the resistive element 20 is equal to the gap d1 between the source electrode wire 12 and the outermost circumference of the resistive element 20.

A gap d2 between the source electrode wire 12 and the outermost circumference of the resistive element 20 is greater than the gap d1 at the position at which the potential-dividing terminal wire 21 is provided along the outermost circumference of the resistive element 20, since the source electrode wire 12 is retracted toward the outside. The region in which the gap d1 between the source electrode wire 12 and the outermost circumference of the resistive element 20 is constant is thus defined from the position adjacent to the potential-dividing-point contact 24 to the slope part 12b.

Comparative Examples

Figure 5:
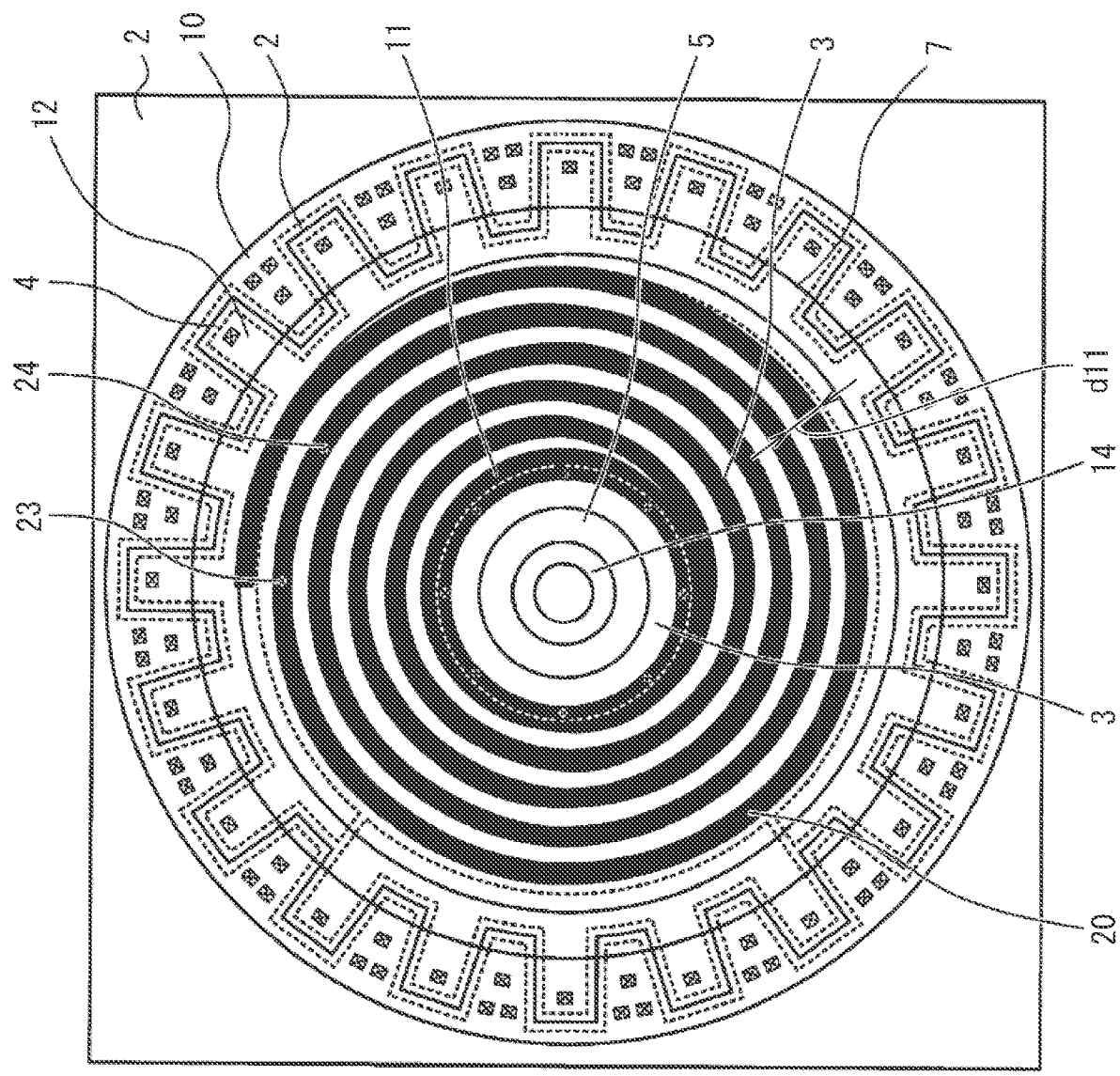
FIG. 5 is a plan view illustrating a semiconductor device of a first comparative example.

A semiconductor device of each of first and second comparative examples is described below. The semiconductor device of the first comparative example differs from the semiconductor device according to the first embodiment illustrated in FIG. 1 in that the ground contact 23 and the potential-dividing-point contact 24 are located on the inner side of the outermost circumference of the resistive element 20 by one round, and the part of the resistive element 20 on the inner circumferential side of the position connected to the ground contact 23 serves as an effective resistor, as illustrated in FIG. 5. The semiconductor device of the first comparative example further differs from the semiconductor device according to the first embodiment in that the ring-shaped inner circumferential side of the source electrode wire 12 is arranged to be concentric with the n⁺-type drain region 5.

When the semiconductor device of the first comparative example is configured to include the resistive element 20 including a polysilicon resistor having a sheet resistance that is increased to 10 kΩ/sq, for example, the polysilicon having a low impurity concentration causes a shift in the resistance value to induce a variation of the potential-dividing point derived from a hydrogen adsorption effect of titanium (Ti) only if the metal wire such as the source electrode wire 12 is arranged contiguously. If the metal wire such as the source electrode wire 12 is located close to the resistive element 20 upon hydrogen annealing that is heat treatment under a hydrogen gas atmosphere for terminating a dangling bond on the surface of the resistive element 20 by hydrogen atoms, Ti contained in the barrier metal in the lowermost layer of the metal wire absorbs the hydrogen atoms, and the dangling bond on the surface of the resistive element 20 cannot be terminated by the hydrogen atoms, leading to a variation in the resistance value.

Figure 6:
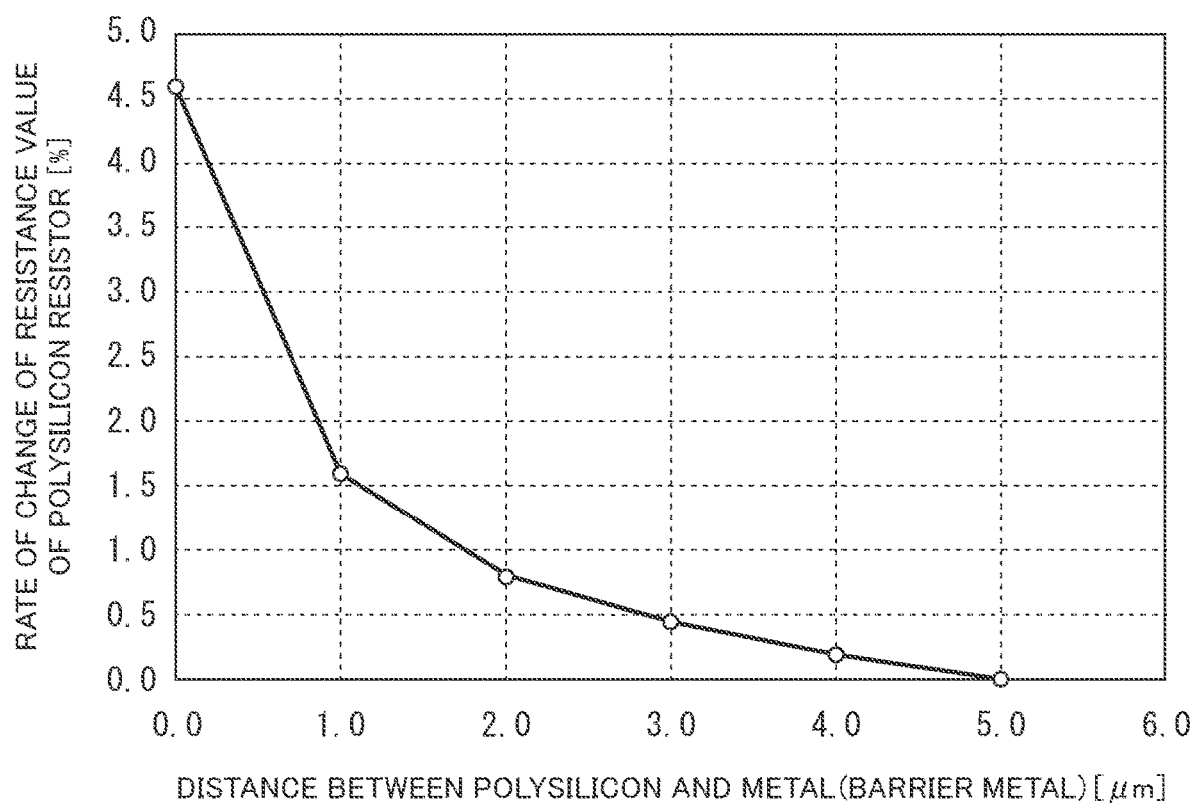
FIG. 6 is a graph showing a relation between a distance between a polysilicon resistor and a metal wire and a rate of change of a resistance value of the polysilicon resistor.

FIG. 6 shows a relation between a distance between the polysilicon resistor and the metal wire and a rate of change of the resistance value of the polysilicon resistor. As shown in FIG. 6, the rate of change of the resistance value of the polysilicon resistor is greater as the distance between the polysilicon resistor and the metal wire is smaller.

The semiconductor device of the first comparative example has the structure in which the inner circumferential side of the source electrode wire 12 is provided to be concentric with the n⁺-type drain region 5, while the resistive element 20 is provided into a spiral state. Since a distance d11 from the outermost circumferential part of the resistive element 20 serving as a resistor (the part on the second outermost circumference of the resistive element 20) to the inner circumference of the source electrode wire 12 is not constant, the resistive element 20 is closer to the source electrode wire 12 as closer to the outer circumferential side, which has an influence on the variation of the potential-dividing point.

Figure 7:
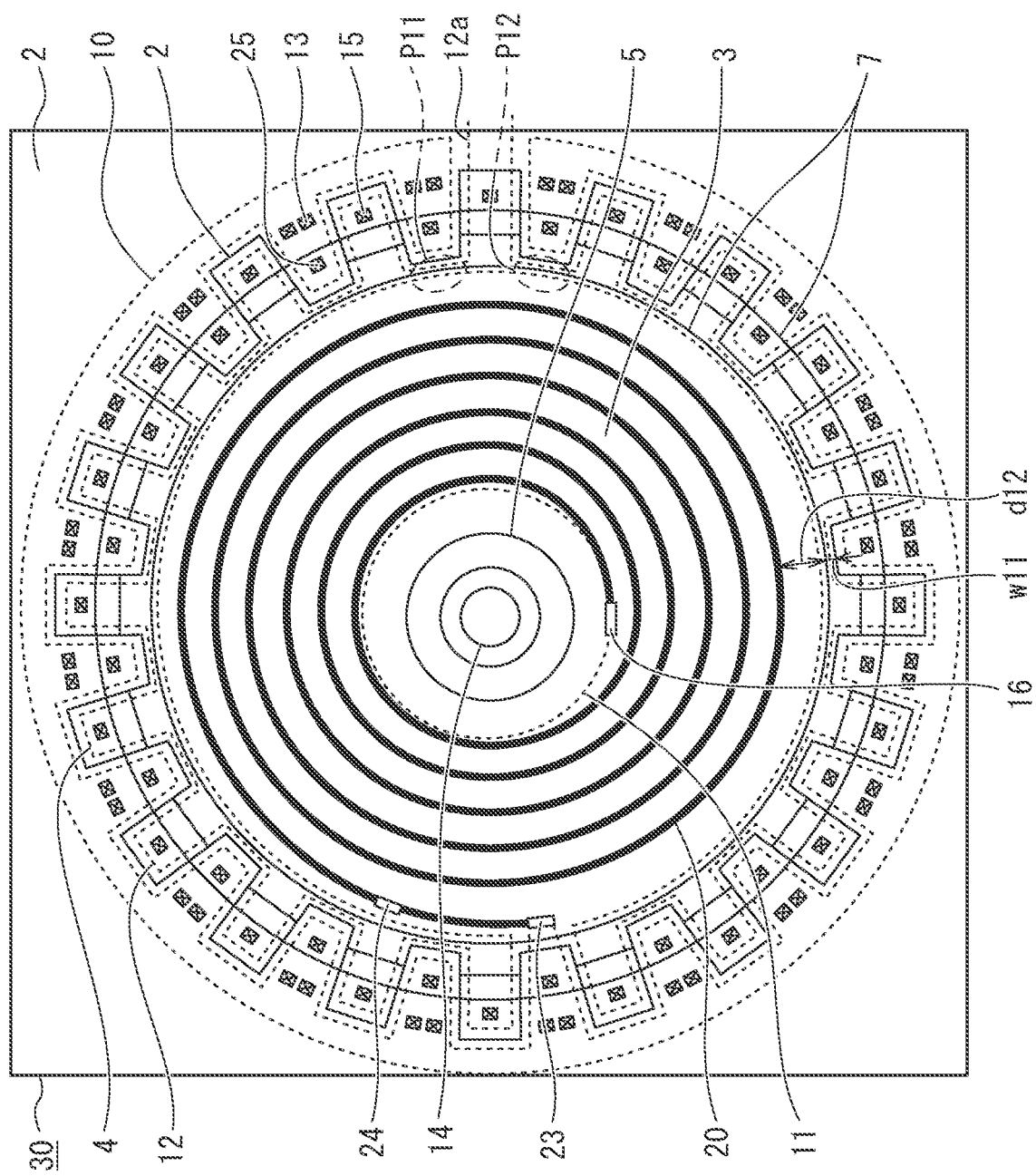
FIG. 7 is a plan view illustrating a semiconductor device of a second comparative example.

To avoid the variation of the potential-dividing point, a semiconductor device of a second comparative example has a configuration that differs from the semiconductor device of the first comparative example illustrated in FIG. 5 in that the source electrode wire 12 is uniformly retracted toward the outside, as illustrated in FIG. 7. The semiconductor device of the second comparative example also differs from the semiconductor device of the first comparative example in that the ground contact 23 and the potential-dividing-point contact 24 are arranged on the outermost circumference of the resistive element 20.

The semiconductor device of the second comparative example has a width w11 of the source electrode wire 12 that is locally decreased since the source electrode wire 12 is uniformly retracted toward the outside, and thus has a problem of exceeding an allowable current density to result in a burnout of the wire at the positions P11 and P12 of the source electrode wire 12 connected to the drawn line 12a. Similar to the semiconductor device of the first comparative example, the semiconductor device of the second comparative example may cause a great variation in the resistance value of the resistive element 20 if the wire width of the resistive element 20 is increased because of an unevenness upon processing, since a distance d12 between the outermost circumferential part of the resistive element 20 serving as a resistor and the source electrode wire 12 varies, leading to a great variation in potential division ratio accordingly.

<Effects>

Compared with the respective semiconductor devices of the first and second comparative examples, the semiconductor device according to the first embodiment has the configuration, as illustrated in FIG. 1 to FIG. 4, in which the planar shape of the source electrode wire 12 is not arranged to be concentric with the n$^+$-type drain region 5 but arranged along the outermost circumference of the spiral-shaped resistive element 20, and the potential-dividing terminal wire 21 is also arranged along the outermost circumference of the resistive element 20. This configuration equalizes the rate of change of the resistance value in the resistive element 20 on the outer circumferential side having a high variation sensibility of the potential-dividing point of the potential-dividing resistor, so as to reduce a variation in the potential division ratio.

The semiconductor device according to the first embodiment also has the configuration in which the distance d1 between the outermost circumference of the resistive element 20 serving as a resistor and the source electrode wire 12 and the distance d3 between the outermost circumference of the resistive element 20 serving as a resistor and the potential-dividing terminal wire 21 are each constant, so as to reduce a variation in the resistance value of the resistive element 20 if the wire width of the resistive element 20 is increased because of an unevenness upon processing, preventing an influence of the variation on the potential division ratio accordingly.

Compared with the semiconductor device of the second comparative example, the semiconductor device according to the first embodiment has the configuration in which the width w1 of the source electrode wire 12 is increased in the clockwise direction, so as to avoid a local decrease in the wire width. Since the width w1 of the source electrode wire 12 can be ensured at the positions P1 and P2 of the source electrode wire 12 connected to the drawn line 12a, the current density of the source electrode wire 12 can be lightened, so as to avoid a burnout of the source electrode wire 12 derived from an inrush current. The first embodiment thus can provide the potential-dividing resistor of the high-resistance polysilicon manufactured at low cost and having high quality and less variation without increasing the number of layers of the source electrode wire 12.

While the arrangement of the source electrode wire 12 along the spiral-shaped resistive element 20 causes a change in the length in the source electrode wire 12 at the part extending toward the inner side at the cut-off part of the substantially ring-like shape, the first embodiment uses the part having the gradually-changing length as the slope part 12b, so as to avoid a local electric-field concentration at the end part of the source electrode wire 12 when a high voltage is applied to the n$^+$-type drain region 5, preventing a reduction in breakdown voltage accordingly.

Modified Example of First Embodiment

Figure 8:
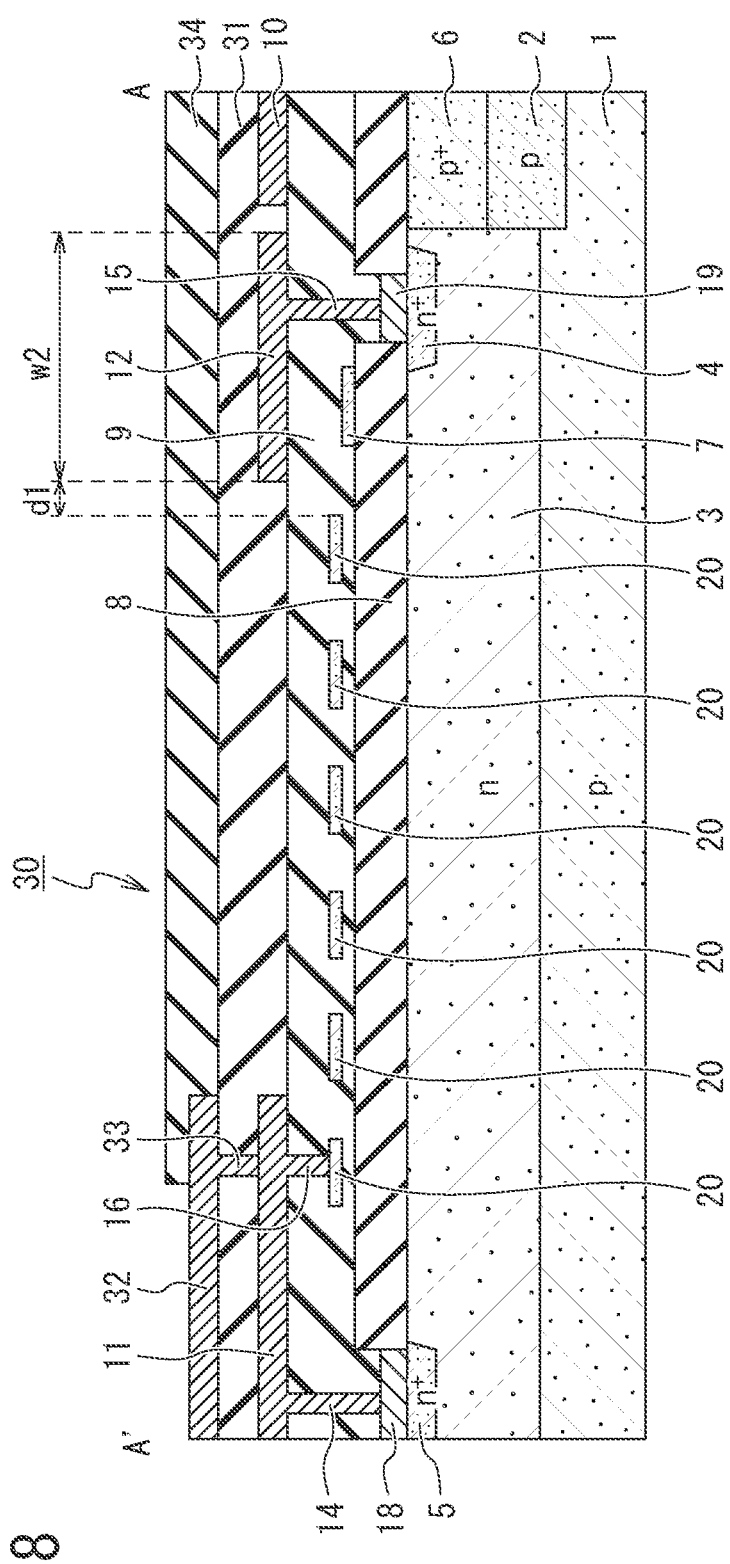
FIG. 8 is a cross-sectional view illustrating a semiconductor device according to a modified example of the first embodiment.
Figure 9:
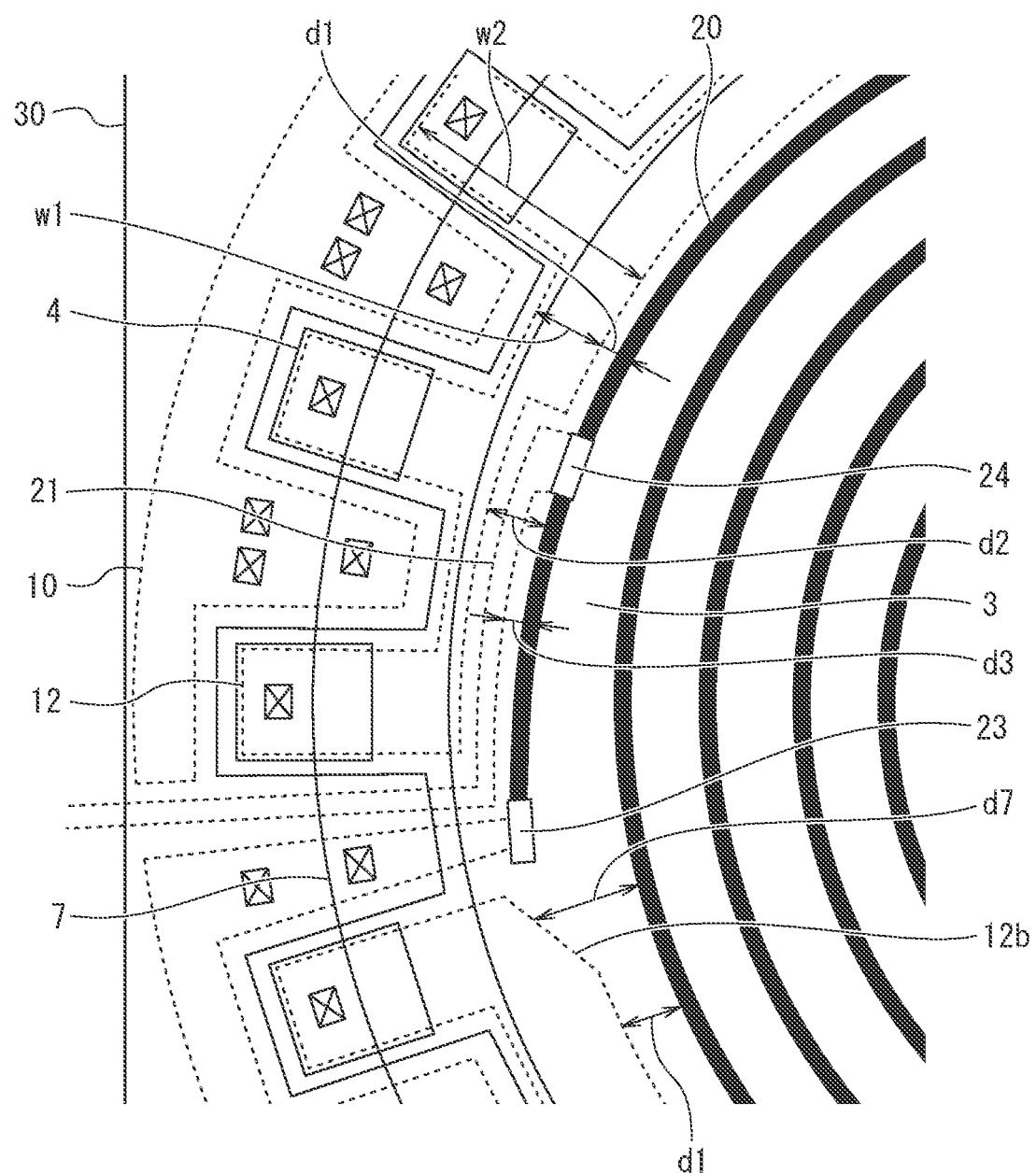
FIG. 9 is a plan view illustrating the semiconductor device according to the modified example of the first embodiment.

A semiconductor device according to a modified example of the first embodiment differs from the semiconductor device according to the first embodiment in the configuration regarding the n$^+$-type drain region 5 and the n$^+$-type source region 4, as illustrated in FIG. 8 and FIG. 9. FIG. 8 is a cross-sectional view corresponding to FIG. 2 illustrating the semiconductor device according to the first embodiment. As illustrated in FIG. 8, the n$^+$-type drain region 5 and the n$^+$-type source region 4 are each selectively deposited at an upper part of the n-type drift region 3. FIG. 9 is a plan view corresponding to FIG. 4 illustrating the semiconductor device according to the first embodiment. As illustrated in FIG. 9, the n$^+$-type source region 4 is not in contact with the p-type gate region 2 but the n-type drift region 3 is interposed between the n$^+$-type source region 4 and the p-type gate region 2. The other configurations of the semiconductor device according to the modified example of the first embodiment are substantially the same as those of the semiconductor device according to the first embodiment, and overlapping explanations are not repeated below. The semiconductor device according to the modified example of the first embodiment having the configuration as illustrated in FIG. 8 and FIG. 9 can also achieve the effects similar to those of the semiconductor device according to the first embodiment.

Second Embodiment

Figure 10:
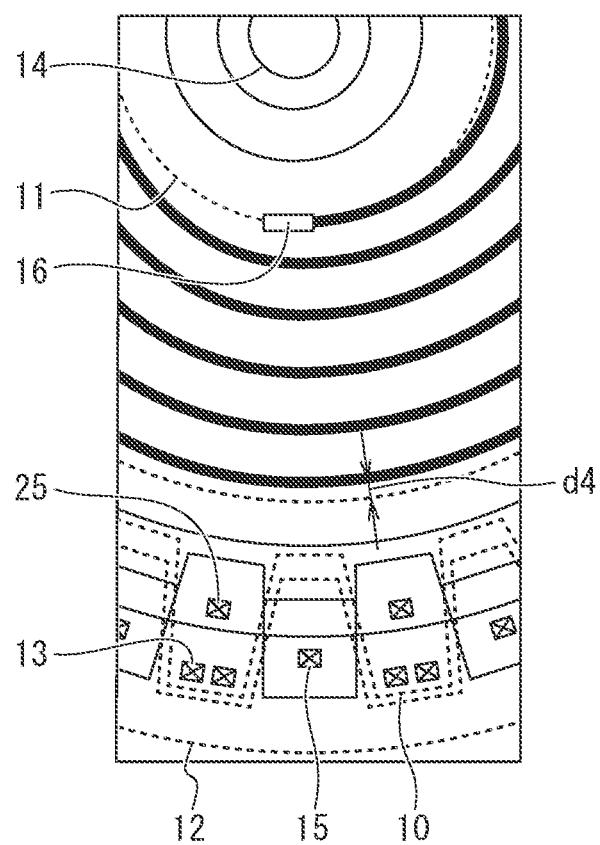
FIG. 10 is a plan view illustrating a semiconductor device according to a second embodiment.

A semiconductor device according to a second embodiment differs from the semiconductor device according to the first embodiment illustrated in FIG. 1 in that the gate electrode wire 10 is arranged on the inner side of the source electrode wire 12, as illustrated in FIG. 10. The semiconductor device according to the second embodiment has a configuration in which the gate electrode wire 10 has a gear-like planar shape on the outer circumferential side, and the source electrode wire 12 has a gear-like planar shape on the inner circumferential side.

The semiconductor device according to the second embodiment also has a configuration in which the gate electrode wire 10 is opposed to the outermost circumference of the spiral-shaped resistive element 20, and has a part at which a distance d4 between the gate electrode wire 10 and the outermost circumference of the resistive element 20 is substantially constant. While FIG. 10 is the plan view illustrating a part of the semiconductor device according to the second embodiment, the gate electrode wire 10 can be opposed to the outermost circumference of the spiral-shaped resistive element 20 and have the substantially-constant distance d4 between the gate electrode wire 10 and the outermost circumference of the resistive element 20 more than halfway around.

As described above, the semiconductor device according to the second embodiment, which has the configuration in which the gate electrode wire 10 opposed to the outermost circumference of the resistive element 20 is arranged parallel to the outermost circumference of the resistive element 20 to have the substantially-constant distance d4 between the gate electrode wire 10 and the outermost circumference of the resistive element 20, can achieve the effects similar to those of the semiconductor device according to the first embodiment.

Third Embodiment

Figure 11:
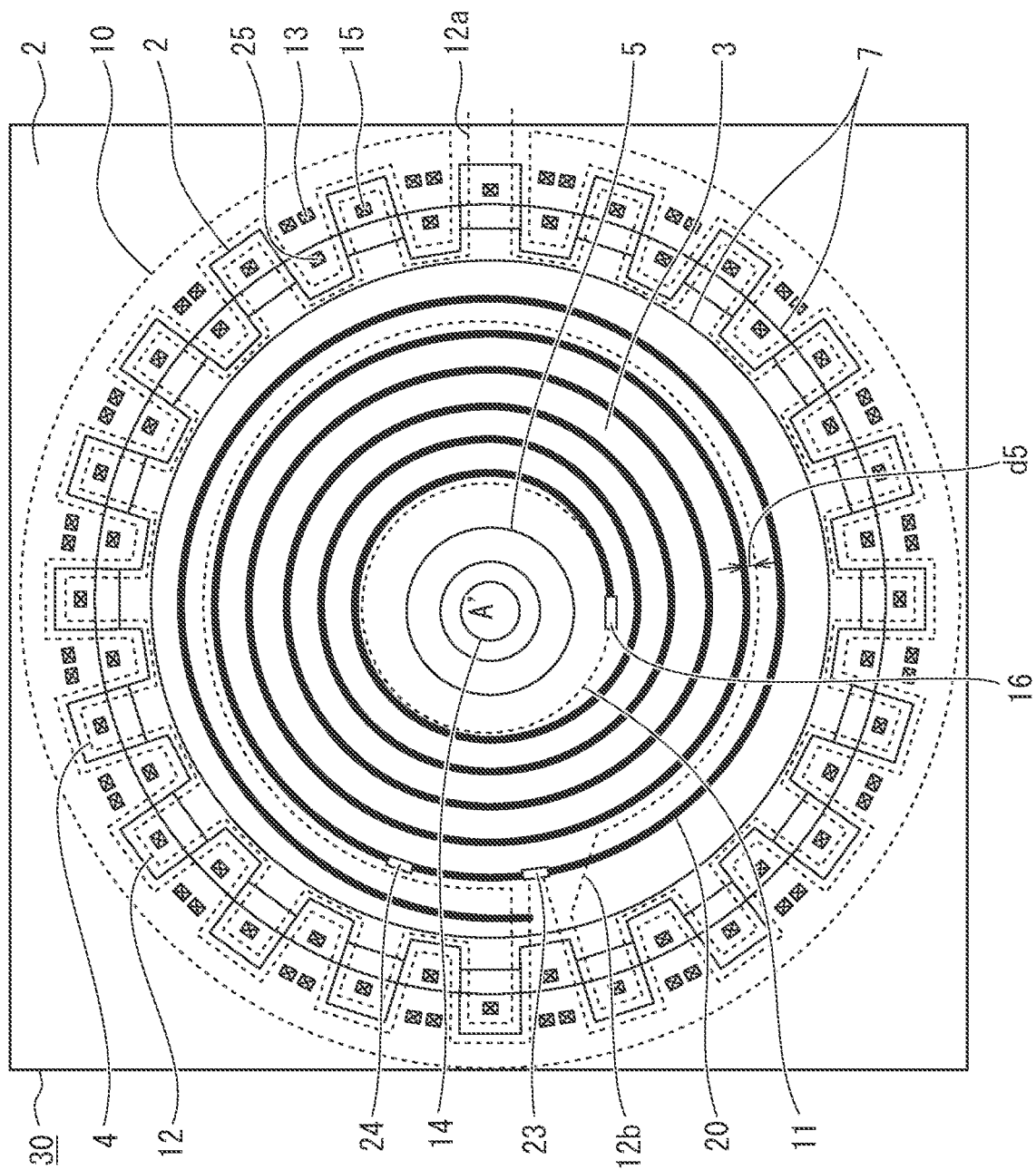
FIG. 11 is a plan view illustrating a semiconductor device according to a third embodiment.

A semiconductor device according to a third embodiment differs from the semiconductor device according to the first embodiment illustrated in FIG. 1 in that the ground contact 23 is located toward the inner side away from the end part of the outer circumference of the spiral-shaped resistive element 20, as illustrated in FIG. 11. FIG. 11 illustrates a case in which the ground contact 23 is arranged on the inner side of the outermost circumference by one round. The potential-dividing-point contact 24 is located on the inner side of the ground contact 23.

The region of the resistive element 20 defined on the outer circumferential side of the part connected to the ground contact 23 does not serve as an effective resistor but is a dummy region. In this case, one round of the resistive element 20 on the inner side of the ground contact 23 is defined as the outermost circumference effectively serving as a resistor. The substantially ring-shaped inner circumferential side of the source electrode wire 12 is located on the inner side of the outermost circumference of the resistive element 20 not serving as a resistor. The substantially ring-shaped inner circumferential side of the source electrode wire 12 is provided to have a constant distance d5 to the resistive element 20 along the outermost circumference effectively serving as a resistor.

The semiconductor device according to the third embodiment, which has the configuration in which the source electrode wire 12 is arranged along the outermost circumference of the resistive element 20 effectively serving as a resistor, can achieve the effects similar to those of the first embodiment. In the semiconductor device according to the first embodiment, the ground contact 23 is provided at the end part of the outer circumference of the resistor 20, and the outermost circumference of the resistive element 20 thus simply serves as a resistor of the resistive element 20.

Fourth Embodiment

Figure 12:
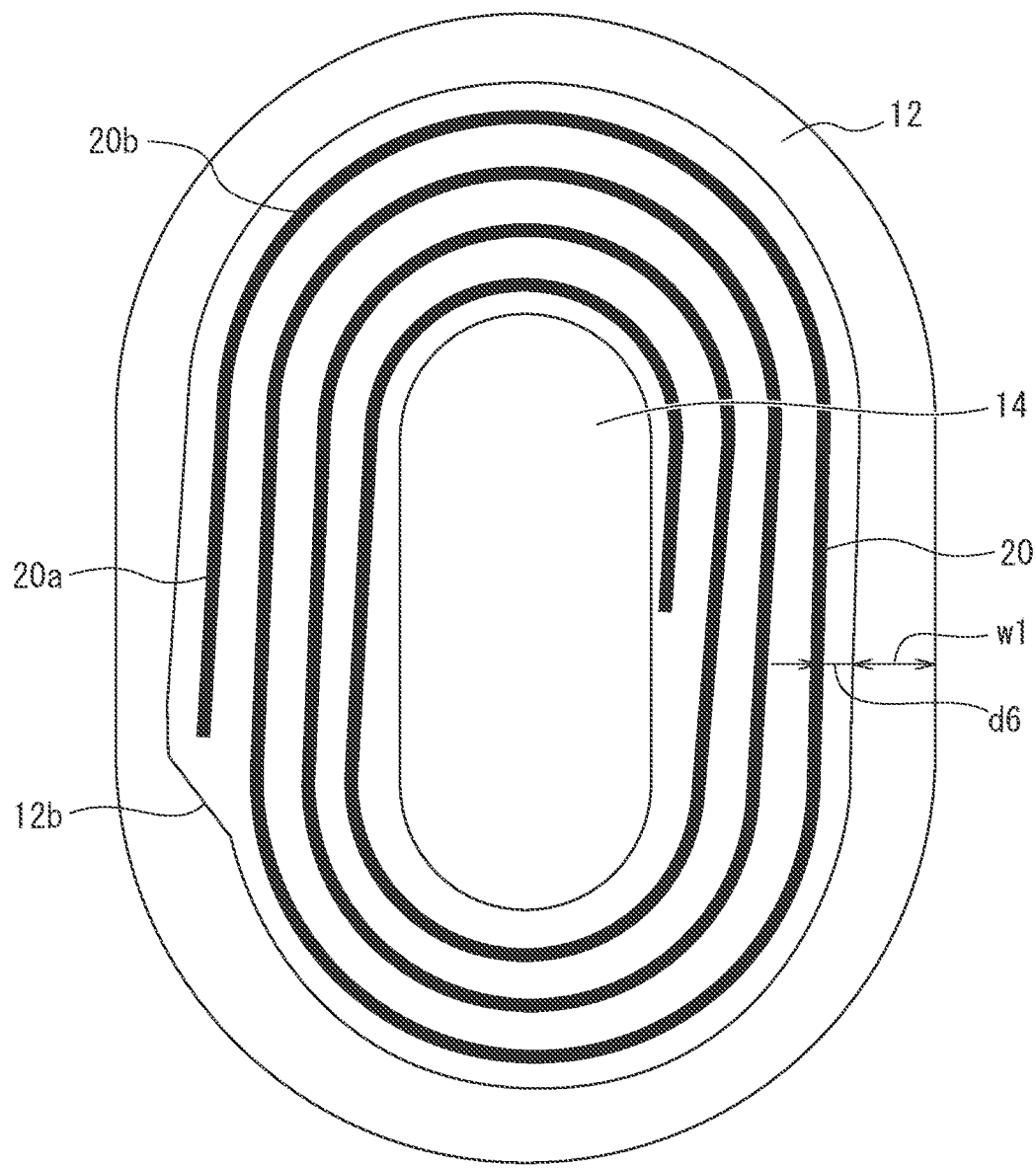
FIG. 12 is a plan view illustrating a semiconductor device according to a fourth embodiment.

A semiconductor device according to a fourth embodiment differs from the semiconductor device according to the first embodiment including the spiral-shaped resistive element 20 with the outline having a substantially circular shape as illustrated in FIG. 1 in that the outline of each of the drain contact 14 and the spiral-shaped resistive element 20 is arranged to have a substantially racetrack-like shape, as illustrated in FIG. 12. FIG. 12 schematically illustrates the respective planar shapes of the drain contact 14, the resistive element 20, and the source electrode wire 12 that are the constituent elements of the semiconductor device according to the fourth embodiment.

The resistive element 20 includes straight parts 20a extending in parallel to each other, and U-shaped curved parts 20b connecting the respective straight parts 20a. The source electrode wire 12 has a substantially ring-like shape, and is opposed to the straight parts 20a and the curved parts 20b located on the outermost circumference of the resistive element 20. The substantially ring-like shape of the source electrode wire 12 on the inner circumferential side is not analogous to the drain contact 14 but is arranged to have a substantially constant distance d6 between the substantially ring-like shape on the inner circumferential side and the respective straight parts 20a and curved parts 20b on the outermost circumference of the resistive element 20.

Although not illustrated, the resistive element 20 may have a substantially elliptic outline. This case is only required to have a configuration in which the metal wire such as the source electrode wire 12 is provided to have a part at which the distance between the metal wire and the outermost circumference of the resistive element 20 is substantially constant.

Other Embodiments

As described above, the invention has been described according to the first to fourth embodiments, but it should not be understood that the description and drawings implementing a portion of this disclosure limit the invention. Various alternative embodiments of the present invention, examples, and operational techniques will be apparent to those skilled in the art from this disclosure.

For example, the respective first to fourth embodiments have been illustrated with the case in which the resistive element 20 is used for the voltage sensing for the startup element of the startup circuit, but can also be applied to any circuit that uses a polysilicon resistor having a spiral-like planar shape as a resistive element.

The respective first to fourth embodiments have been illustrated with the case of using the JFET, but can also be applied to an insulated-gate field-effect transistor such as a MOSFET, instead of the JFET.

The respective first to fourth embodiments have been illustrated with the case in which the source electrode wire 12, the potential-dividing terminal wire 21, and the gate electrode wire 10 are arranged so as to have the substantially constant distances d1, d3, and d4 to the outermost circumference of the resistive element 20 serving as a resistor. In addition to the source electrode wire 12, the potential-dividing terminal wire 21, and the gate electrode wire 10, a metal wire having barrier metal including titanium (Ti), when arranged to be opposed to the outermost circumference of the resistive element 20 serving as a resistor, is also only required to have a substantially constant distance to the outermost circumference of the resistive element 20 serving as a resistor.

The respective configurations disclosed in the first to fourth embodiments of the present invention and the respective modified examples can be combined together as necessary within a range without contradicting each other. As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present Specification.

What is claimed is:
1. A semiconductor device comprising:
a first region of a second conductivity type deposited at an upper part of a semiconductor base body of a first conductivity type;
a second region of the second conductivity type deposited at an upper part of the semiconductor base body so as to be in contact with the first region;

a third region of the second conductivity type deposited at an upper part of the semiconductor base body and opposed to the first region with the second region interposed so as to be in contact with the second region;
a fourth region of the first conductivity type deposited at an upper part of the semiconductor base body so as to be in contact with the second region;
an interlayer insulating film covering the second region;
a resistive element having a spiral-like planar shape provided inside the interlayer insulating film;
a first electrode wire electrically connected to the first region and one end of the resistive element;
a second electrode wire electrically connected to the third region and provided along a circumference of the resistive element;
a third electrode wire electrically connected to the fourth region and provided along the circumference of the resistive element; and
a potential-dividing terminal wire electrically connected to the resistive element,
wherein a metal wire opposed to an outermost circumference serving as a resistor of the resistive element has a part at which a gap between the metal wire and the outermost circumference is constant.

2. The semiconductor device of claim 1, wherein the metal wire is at least any of the second electrode wire, the third electrode wire, and the potential-dividing terminal wire.

3. The semiconductor device of claim 2, wherein the second electrode wire is opposed to the outermost circumference halfway around or more, and has a part at which a gap between the second electrode wire and the outermost circumference is constant.

4. The semiconductor device of claim 3, wherein:
the potential-dividing terminal wire has a part opposed to the outermost circumference and having a constant gap between the potential-dividing terminal wire and the outermost circumference; and
the gap between the potential-dividing terminal wire and the outermost circumference is equal to the gap between the second electrode wire and the outermost circumference.

5. The semiconductor device of claim 3, wherein the second electrode wire includes a slope part at an end part at which the gap between the second electrode wire and the outermost circumference is constant.

6. The semiconductor device of claim 1, wherein an outline of the planar shape of the resistive element is a circular shape, an elliptic shape, or a racetrack-like shape.

7. The semiconductor device of claim 1, wherein the resistive element has a sheet resistance of 1 kΩ/sq or greater.

8. The semiconductor device of claim 1, wherein the resistive element is a polysilicon resistor.

9. The semiconductor device of claim 1, wherein the resistive element is electrically connected to the third electrode wire at a position on an outer circumferential side of a position at which the resistive element is electrically connected to the potential-dividing terminal wire.

10. The semiconductor device of claim 1, wherein the fourth region is provided to extend from an outside of the third region to a part closer to the first region than the third region.

11. The semiconductor device of claim 10, wherein the fourth region has a planar shape interposing the third region in a direction perpendicular to a direction connecting the first region and the third region.

* * * * *